(12) United States Patent
Papageorgiou

(10) Patent No.: US 8,413,028 B2
(45) Date of Patent: Apr. 2, 2013

(54) MANAGEMENT OF DECODING EFFORT IN AN ITERATIVE DECODING SCENARIO

(75) Inventor: Andrew Papageorgiou, Cambridgeshire (GB)

(73) Assignee: Cambridge Silicon Radio Limited, Cambridge (GB)

( * ) Notice: Subject to any disclaimer, the term of this patent is extended or adjusted under 35 U.S.C. 154(b) by 344 days.

(21) Appl. No.: 12/836,045

(22) Filed: Jul. 14, 2010

(65) Prior Publication Data

US 2012/0017133 A1   Jan. 19, 2012

(51) Int. Cl.
| | |
|---|---|
| *H03M 13/03* | (2006.01) |
| *H04L 5/12* | (2006.01) |
| *H04L 23/02* | (2006.01) |
| *H04L 27/06* | (2006.01) |
| *H03D 1/00* | (2006.01) |

(52) U.S. Cl. ........ 714/786; 375/341; 375/262; 714/794; 714/795

(58) Field of Classification Search .................. None
See application file for complete search history.

(56) References Cited

U.S. PATENT DOCUMENTS

| | | | | |
|---|---|---|---|---|
| 7,765,453 | B2 * | 7/2010 | Duggan | 714/755 |
| 2008/0148133 | A1 * | 6/2008 | Duggan | 714/796 |
| 2010/0262886 | A1 * | 10/2010 | Ren | 714/751 |

* cited by examiner

*Primary Examiner* — Guerrier Merant
(74) *Attorney, Agent, or Firm* — RatnerPrestia

(57) ABSTRACT

Schemes for creating a surplus of decoding iterations in a decoder are described. The surplus can be used to augment the decoding of signal blocks. The option of using an idle decoder to decode blocks marked as unproductive for decoding is also described.

13 Claims, 4 Drawing Sheets

MANAGEMENT OF DECODING EFFORT IN AN ITERATIVE DECODING SCENARIO

FIELD

The invention relates to the field of signal decoding.

It is common practice to encode electrical data signals that are to be transmitted from place to place. The encoding is added with the aim of preventing mistakes or errors from appearing in the data signal at the place where it is received.

BACKGROUND

Many types of error prevention coding (or error hardening) exist. Turbo encoding is a popular type of error prevention encoding that is used in the cellular telecommunications arena. Signals that are turbo encoded at a transmission site are then subjected to turbo decoding at the place where they are received. The error protection scheme composed of turbo encoding and turbo decoding is well known in the digital communications field. For example, see section 8.2.10 "Parallel and Serial Concatenated Convolutional Codes" in "Digital Communications" by John G. Proakis, 4th Edition, 2001, McGraw-Hill.

Turbo decoding is performed iteratively on a turbo encoded block of received data until the decoding is "successful". That is to say, until such time as the decoded version of the block is adjudged to be a sufficiently accurate facsimile of the block that was turbo encoded and transmitted. Typically, a turbo decoder is constrained to performing a maximum number of turbo decoding iterations on a block of turbo encoded received data before giving up on the block as improperly received. This limitation serves to control the time, processing effort and energy that is devoted to the attempt that is made to decode a given block of received turbo encoded data and this has obvious benefits in the context of a device, such as a mobile telephone, that is constrained in terms of its processing resources and energy supply.

The UMTS standards specify a high data rate mode of communication known as HSDPA. According to the HSDPA scheme, a transmitter transmits packets of data to a receiver. These packets contain a series of blocks of data, which represent the data payload of the packet. For example, the payload might be a segment of a movie clip or an element of a web page that is to be presented on the receiving device. Within an HSDPA packet, the data blocks are individually subjected to turbo encoding. This means that a receiver, upon acquiring an HSDPA packet, must turbo decode all of the blocks in the packet. If a receiver fails to turbo decode a block within an HSDPA packet, then the receiver requests a retransmission of the packet that contains the failed block.

FIG. 1 shows schematically a series of received HSDPA packets. In FIG. 1, three consecutive packets are shown, labelled PACKET 1, PACKET 2 and PACKET 3. In the example shown in FIG. 1, each of the packets contains N turbo encoded blocks of data. It should be noted that, in practice, the packets need not be transmitted contiguously in as much as there may be delays between the transmission of a packet following the completion of the transmission of an earlier packet. Additionally, the number of blocks within a packet may vary from one packet to another.

In a typical turbo decoder design, the turbo decoder will apply a fixed budget of turbo decoding iterations to each block that it receives and, in the context of HSDPA, will attempt to decode each block from the packets that it receives.

SUMMARY

According to one aspect, an embodiment of the invention provides a decoder arranged to decode a signal comprising a number of packets, wherein each packet contains at least one block of encoded data and the decoder comprises a decoding engine arranged to attempt to decode the blocks by applying decoding iterations to the blocks, and a decoding manager arranged to increase from a default value the maximum number of iterations that the decoding engine can apply to a given block in dependence upon whether the decoding of another block in another packet was successful.

Thus, the number of decoding iterations that can be applied to a given block is made flexible in dependence upon decoding outcomes in other packets. In turn, this facilitates a more flexible approach to decoding.

Using the techniques of the invention, decoding iterations can be husbanded so that they are used where they are most likely to have an impact.

In certain embodiments, the decoding manager is arranged to increase the maximum number for the given block upon unsuccessful decoding of the other block in the other packet causing the decoding of one or more blocks in the other packet to go unattempted. In other words, unspent decoding iterations from the aborted decoding of one packet can be used to augment the budget of decoding iterations for another block in another packet.

In certain embodiments, the decoding manager is arranged to increase the maximum number for the given block upon recognition of the other block being decoded successfully from an earlier transmission of the other packet. In other words, if a block has been decoded successfully already, then a newly received version of that block need not be decoded and decoding iterations that would have been set aside for the newly received version of the block can instead be applied to other blocks in the same or in a different packet.

The packet may be buffered in a memory within the decoder prior to being processed by the decoding engine.

The packets may contain the same or different numbers of blocks.

The decoding engine may be a single decoder or a pool of decoders working at least partially in parallel. The decoding engine may be implemented in hardware, for example as part of a design in a silicon chip. The decoding engine may be implemented at least partly in software as instructions to be executed through a data processor. The same considerations apply to the decoding manager, which may be implemented in hardware, in software or as a mixture of the two.

In certain embodiments, the blocks are blocks of turbo encoded data, the decoding engine is a turbo decoding engine and the iterations are turbo decoding iterations. In this context, the packets may be HSDPA packets, for example.

The decoding engine will typically form part of a telecommunications receiver, itself typically forming part of a cell phone or a base station within a telecommunications network.

BRIEF DESCRIPTION OF THE DRAWINGS

By way of example only, some embodiments of the invention will now be described with reference to the accompanying drawings, in which.

DETAILED DESCRIPTION

Figure 2:
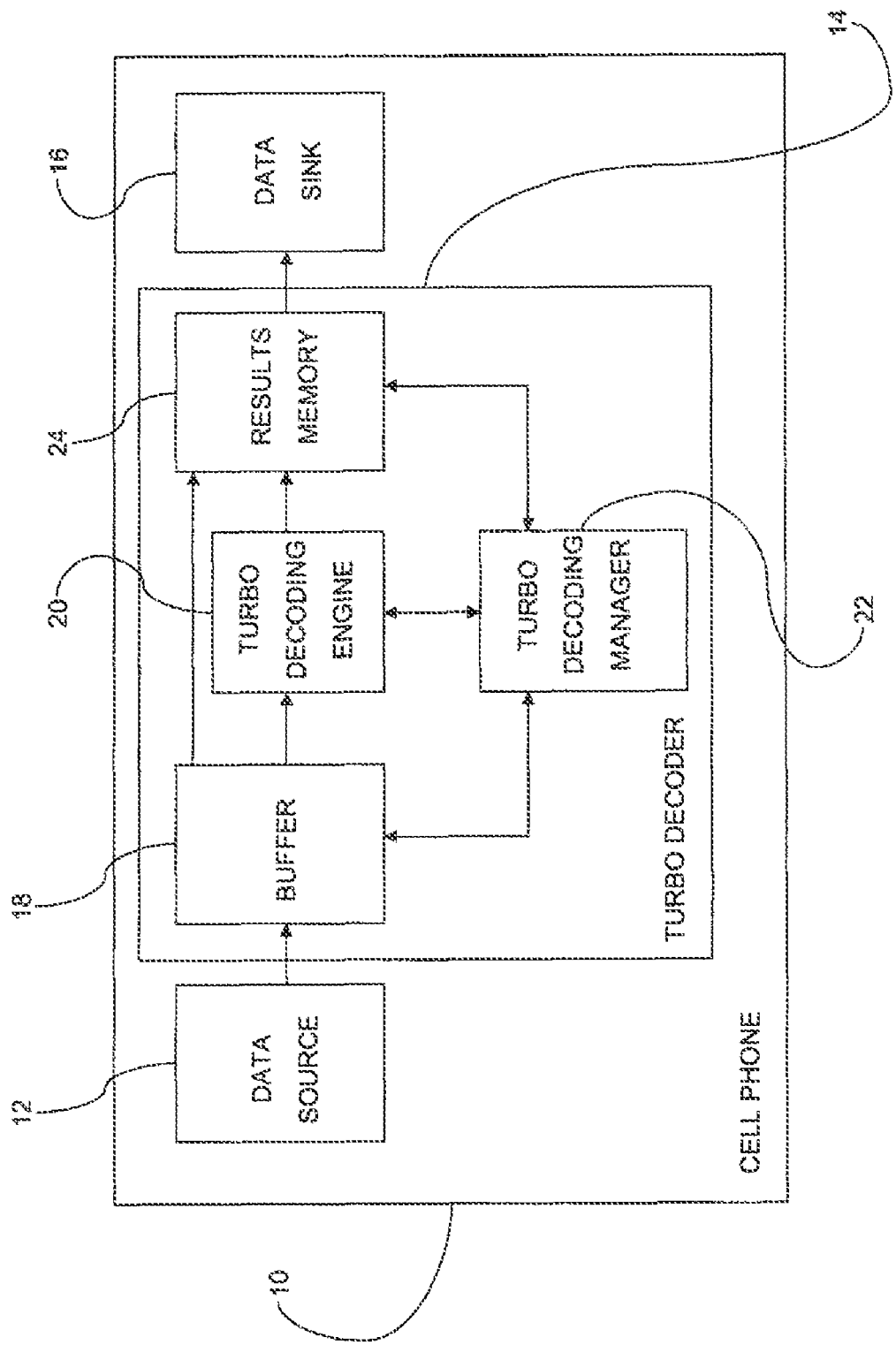
FIG. 2 is a schematic block diagram of a turbo decoder in a cell phone.

FIG. 2 is a schematic illustration of a cell phone 10. FIG. 2 shows only those elements of the cell phone 10 that are most closely concerned with explaining the details of an embodiment of the invention. It will be understood by the skilled person that, in practice, the cell phone 10 will comprise many elements besides those shown in FIG. 2.

As shown in FIG. 2, the cell phone 10 comprises a data source 12, a turbo decoder 14 and a data sink 16. Additionally, the turbo decoder 14 is shown as comprising a buffer 18, a turbo decoding engine 20, a turbo decoding manager 22 and a results memory 24. The data source 12 provides HSDPA packets to the turbo decoder 14 for decoding. The turbo decoder 14 decodes the blocks within these packets and supplies the blocks in decoded form to the data sink 16.

The data source 12 comprises technology for recovering HSDPA packets from radio waves arriving at the telephone. In brief, the data source comprises an antenna (for acquiring the radio signals), and RF front end module (for amplifying, filtering and frequency down-converting radio signals acquired through the antenna), a digital to analogue converter (for converting the analogue signals that have been processed by the RF front end module into digital signals), and an equaliser (for removing intersymbol interference due to the wanted signal arriving at the cell phone by multiple paths).

The cell phone 10 directs decoded HSDPA blocks from the results memory 24 into the data sink 16. Typically, the data sink 16 involves some mechanism for presenting the data from the decoded HSDPA blocks to the user of the telephone, for example in the form of reconstructed video clips, web pages, telephone conversation dialogue or music tracks.

Although the nature of the data source 12 and the data sink 16 have been outlined, their precise nature is peripheral to the invention and can take many different forms, as will be well understood by persons skilled in the art of digital communications.

Figure 1:
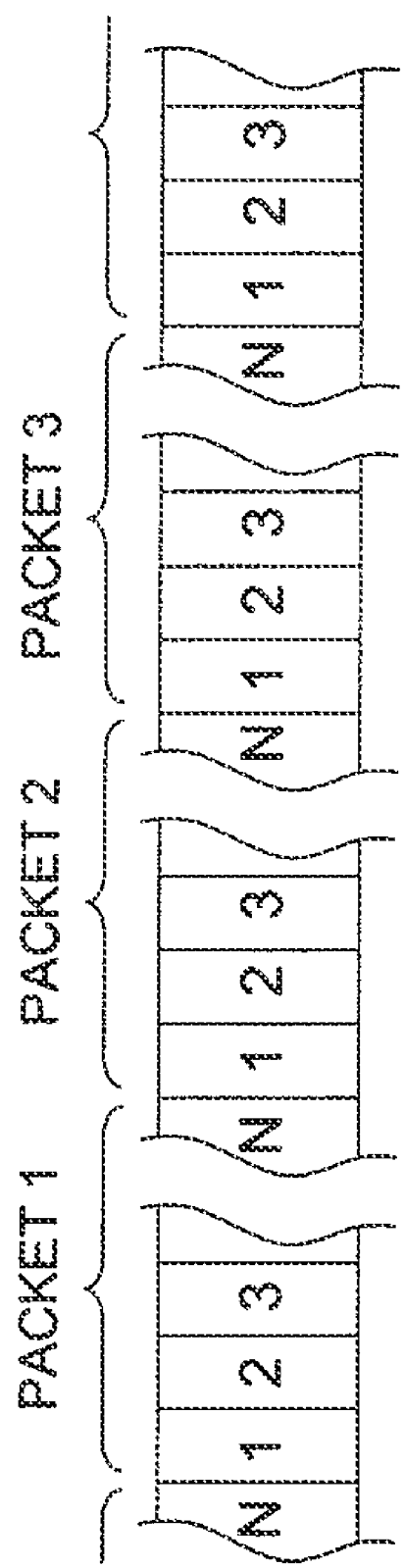
FIG. 1 shows an example of a packet structure for a HSDPA signal.

The turbo decoder 14 includes a buffer 18 which is a memory for storing HSDPA packets until the turbo decoding engine 20 is ready to decode them. The HSDPA packets arrive at the buffer 18 from the data source 12 and have the general format that was described by reference to FIG. 1. That is to say, the HSDPA packets arriving at buffer 18 each comprise a number of blocks, each block within a packet being separately turbo encoded. The turbo decoding engine 20 attempts to turbo decode the blocks of the HSDPA packets held in the buffer 18.

In attempting to decode a block from the buffer 18, the turbo decoding engine 20 will perform successive iterations of a turbo decoding process on the block. In attempting to turbo decode a given block from the buffer 18, the turbo decoding engine will perform successive turbo decoding iterations until such time as the block is adjudged to be correctly decoded (e.g. by performing a CRC check on the putatively decoded block) or until a budget of turbo decoding iterations has been expended. The result of the turbo decoding engine's attempt at decoding a given block from the buffer 18 is then stored into the results memory 24. The result of an attempt to decode a given block from the buffer 18 will be a block of data that has been adjudged to be successfully or unsuccessfully decoded within the allowed iteration budget. The iteration budget that the turbo decoding engine 20 has for decoding a given block from buffer 18 is determined by the turbo decoding manager 22.

The turbo decoding manager 22 is linked for communication with the turbo decoding engine 20 and can inspect the buffer 18 and the results memory 24. The turbo decoding manager 22 can set or adjust the budget of turbo decoding iterations that the turbo decoding engine 20 can apply to a given block from the buffer 18 and is informed by the turbo decoding engine 20 of whether or not the turbo decoding of a block from the buffer 18 is adjudged to be successful. The turbo decoding manager 22 also keeps track of the identity of the packets to which the blocks being operated on by the turbo decoding engine 20 belong.

When the turbo decoding engine 20 fails to decode a block from buffer 18, this fact is reported to the turbo decoding manager 22. The turbo decoding manager 22 determines which HSDPA packet the failed block belongs to and checks if there are any blocks of that packet on which the turbo decoding engine 20 has yet to attempt decoding. If any such blocks exist, then they are moved to the results memory and are flagged as failed blocks. The budgets of decoding iterations for these blocks that have foregone a turbo decoding attempt then contribute to a decoding iteration surplus that is used by the turbo decoding manager 22 to augment the turbo decoding budgets of other blocks that are to be processed by the turbo decoding engine 20. The manner of this augmentation will be described later.

As was mentioned earlier, a receiver will request the retransmission of an HSDPA packet in the case where the receiver has not been able to turbo decode successfully a block of the packet. Thus, when a retransmitted packet is loaded from the data source 12 into the buffer 18, it is quite possible that some of the blocks of that packet have already been decoded successfully and reside in decoded form in the results memory 24. Accordingly, the turbo decoding manager 22 is arranged to keep track of the HSDPA packets for which retransmission has been requested. The turbo decoding manager 22 also inspects the buffer 18 for the arrival of packets that are retransmissions. Upon detecting the presence of a retransmitted packet in the buffer 18, the turbo decoding manager 22 inspects the results memory 24 to identify which blocks, if any, of that packet have been adjudged as correctly decoded. If the turbo decoding manager 22 detects that the buffer 18 contains a retransmitted block that has already been adjudged as correctly decoded, then the turbo decoding manager 22 inhibits the turbo decoding engine from attempting to decode that retransmitted block, thereby saving processing effort.

When the turbo decoding manager 22 acts to inhibit an attempt to turbo decode retransmitted blocks in the buffer 18 that have already been successfully decoded to the results memory 24, the turbo decoding iteration budgets that would have been allocate to those blocks contribute towards a surplus of decoding iterations. This surplus of decoding iterations is distributed to augment the budgets of decoding iterations of any blocks that remain to be turbo decoded in buffer 18, in a manner that will now be described.

Due to the two mechanisms outlined above, the turbo decoding engine 20 can forgo turbo decoding attempts on blocks in the buffer 18, thereby liberating the decoding iteration budgets of those blocks to contribute to a surplus of decoding iterations. The turbo decoding manager 22 uses this surplus to augment the iteration budgets of other blocks that remain to be decoded. For example, the turbo decoding manager 22 can be set up to allocate these surplus turbo decoding iterations by adding one iteration to the budget of each subsequent block whose decoding is to be attempted by the turbo decoding engine 20 until such time as the decoding iteration surplus is spent. Of course, other schemes for using up the budget of surplus turbo decoding iterations will be apparent to the skilled person.

By allocating the surplus in this way, the turbo decoding manager 22 enhances the effectiveness of its turbo decoding iterations (which are available up to a maximum number per unit time) thereby enhancing the data throughput of the cell phone 10. Conversely, the surplus distributing activity of the turbo decoding manager could instead be used to reduce the performance capabilities that are needed of turbo decoding engine in order to attain a desired data throughput.

Typically, HSDPA packets will arrive at the cell phone 10 in an ad hoc fashion. Therefore, at some given time, it can result that the buffer 18 may not contain any blocks on which turbo decoding attempts need to be made by the turbo decoding engine 20. For example, the buffer 18 may contain no blocks waiting for processing by the turbo decoding engine 20 or it may be the case that the only blocks remaining in the buffer 18 are, for example, retransmitted blocks that have already been successfully decoded by the turbo decoding engine as a result of previous transmissions to the cell phone 10. In such circumstances, the turbo decoding engine 20 may be regarded as idle.

The turbo decoding manager 22 keeps track of which blocks in the results memory 24 have not been turbo decoded successfully. Such blocks may, for example, be blocks on which turbo decoding attempts were made unsuccessfully or they may be blocks for which turbo decoding was bypassed on account of a failure to successfully turbo decode another block in the same HSDPA packet. The turbo decoding manager 22 can designate as retry blocks some or all of those blocks in the results memory that are not the result of a successful turbo decoding attempt. When the turbo decoding engine 20 becomes idle, the turbo decoding manager 22 can instruct the turbo decoding engine 20 to perform further turbo decoding iterations on retry blocks from the results memory 24 in the hope of successfully turbo decoding them and avoiding the need to await a retransmission of the packet or packets containing the retry blocks.

Figure 3:
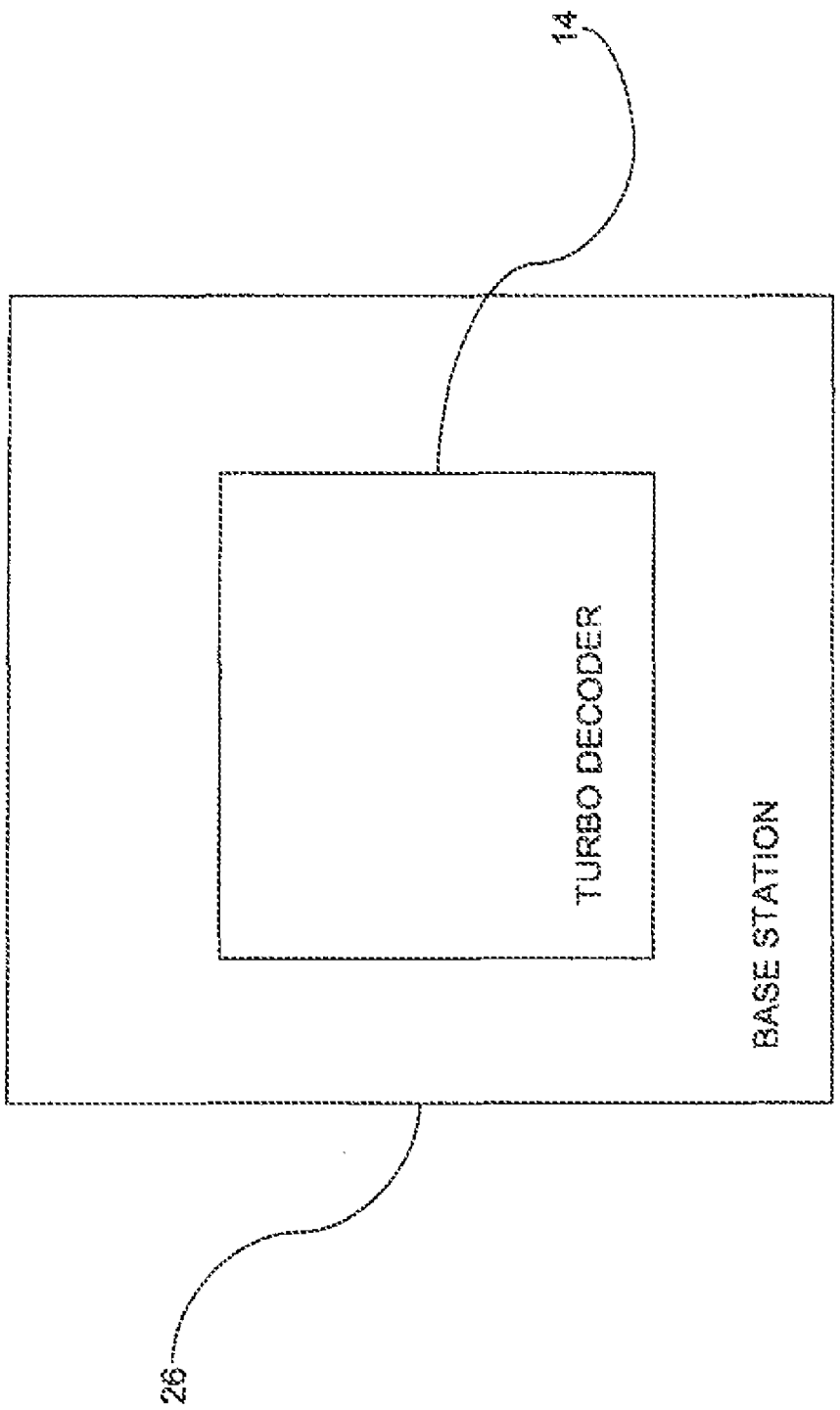
FIG. 3 is a block diagram schematically illustrating the applicability of the turbo decoder of FIG. 2 to a base station of a telecommunications network.
Figure 4:
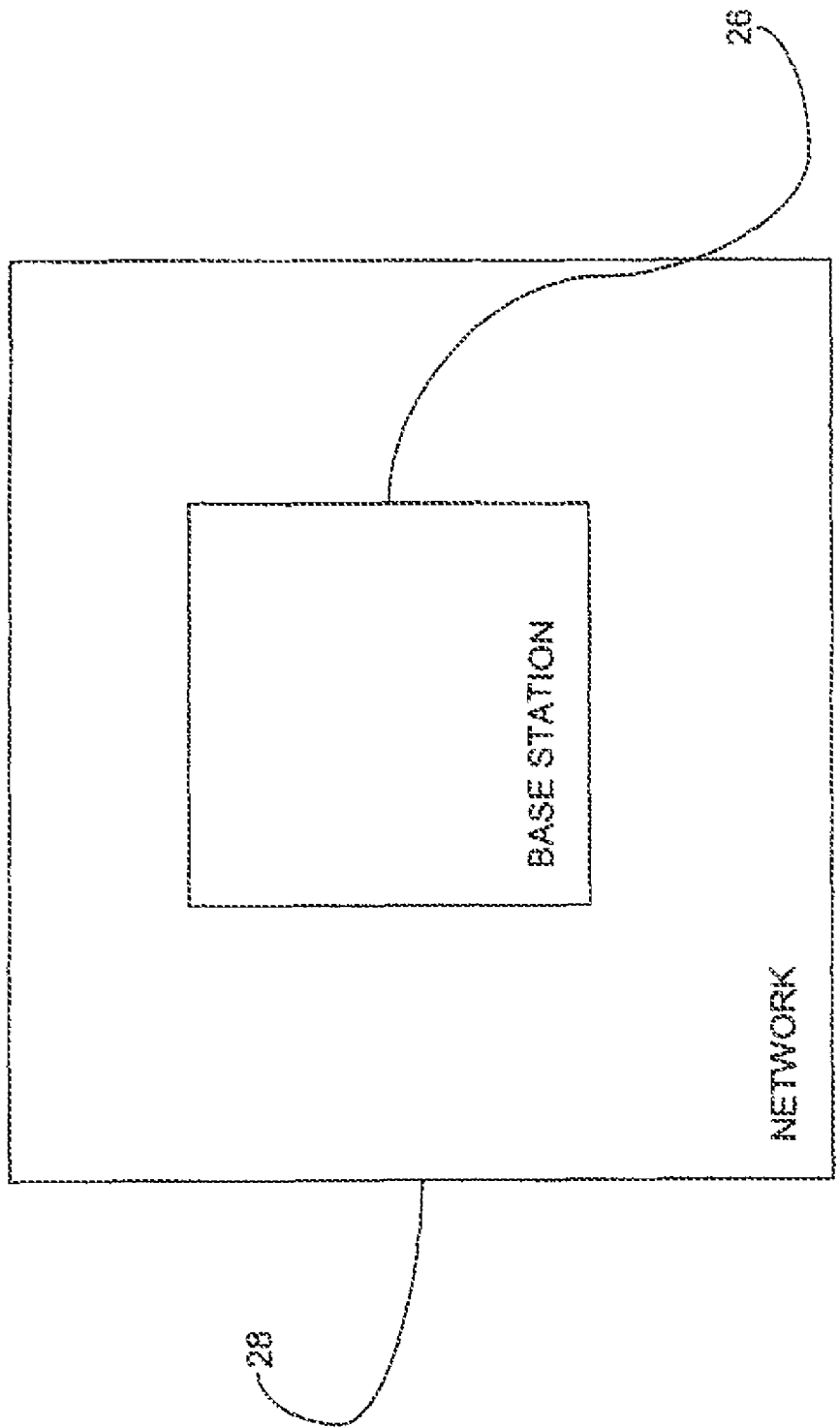
FIG. 4 illustrates schematically the use of the base station of FIG. 3 within a telecommunications network.

FIG. 2 described the implementation of a turbo decoder design in a cell phone. Of course, the design used by turbo decoder 14 could equally well be used in other types of telecommunications receiver. For example, FIG. 3 illustrates schematically the use of the turbo decoder 14 within a base station 26 of a telecommunications network. Furthermore, FIG. 4 schematically illustrates the use of the base station 26 within a telecommunications network 28.

It will be apparent to the skilled person that the elements shown in FIG. 2 would not necessarily correspond directly to physical entities within an actual realisation of the cell phone 10. For example, the turbo decoding engine 20 and the turbo decoding manager 22 may be implemented in hardware as part of the layout on a single silicon chip. Indeed, such a chip could also include memory and thus have on board also the buffer 18 and the results memory 24. In practice, it is likely that the turbo decoder 14 would be implemented in hardware as part of a layout on a silicon chip that is configured to perform other tasks besides (such as channel estimation and transmit power control).

It will be apparent to the skilled person that various modifications can be made to the turbo decoder 14 that has just been discussed in relation to FIG. 2. For example, the buffer 18 and the results memory 24 could be virtual memories overlaid on the same physical memory. That is to say, a block to be turbo decoded could be read out of memory, undergo turbo decoding and then the result could be overwritten in the same location in the memory with a flag indicating whether or not turbo decoding of that block has been adjudged successful. As a further example, the turbo decoding engine could be implemented as a single high performance turbo decoder or as a group or pool of relatively lower performance turbo decoders that operate at least partially in parallel in the performance of decoding iterations.

The embodiments described with reference to the Figures relate to turbo decoding. However the iteration management techniques of the invention could be applied equally well to other types of iterative decoding scheme.

The invention claimed is:

1. A decoder arranged to decode a signal comprising a number of packets, wherein each packet contains at least one block of encoded data and the decoder comprises:
   a decoding engine, including a processor, arranged to attempt to decode the blocks by applying decoding iterations to the blocks, and
   a decoding manager arranged to increase from a default value the maximum number of iterations that the decoding engine can apply to a given block in dependence upon whether the decoding of another block in another packet was successful,
   wherein the decoding manager is arranged to increase the maximum number of iterations for the given block upon unsuccessful decoding of the other block in the other packet causing the decoding of one or more blocks in the other packet to go unattempted.

2. A decoder according to claim 1, wherein the blocks are blocks of turbo encoded data, decoding engine is a turbo decoding engine and the iterations are turbo decoding iterations.

3. A telecommunications receiver comprising a decoder according to claim 1.

4. A cell phone comprising a receiver according to claim 3.

5. A telecommunications network base station comprising a receiver according to claim 3.

6. A telecommunications network comprising a base station according to claim 5.

7. A decoder according to claim 1, wherein the default value is not the same for all blocks of the signal.

8. A decoder according to claim 1, wherein the decoding manager is arranged to detect the unsuccessful decoding of the other block and in response inhibit the attempted decoding of further blocks of the other packet by the engine.

9. A decoder arranged to decode a signal comprising a number of packets, wherein each packet contains at least one block of encoded data and the decoder comprises:
   a decoding engine, including a processor, arranged to attempt to decode the blocks by applying decoding iterations to the blocks, and
   a decoding manager arranged to increase from a default value the maximum number of iterations that the decoding engine can apply to a given block in dependence upon whether the decoding of another block in another packet was successful,
   wherein the decoding manager is arranged to increase the maximum number of iterations for the given block upon recognition of the other block being decoded successfully from an earlier transmission of the other packet.

10. A decoder according to claim 9, wherein the decoding manager is arranged to detect the fact that the other block was decoded successfully from an earlier transmission of the other packet and in response inhibit the attempted decoding of the other block.

11. A decoder arranged to decode a signal comprising a number of packets, wherein each packet contains at least one block of encoded data and the decoder comprises:

a decoding engine, including a processor, arranged to attempt to decode the blocks by applying respective budgets of decoding iterations to the blocks, and a decoding manager arranged to detect the failure of the decoding engine to decode a block within its respective budget, command the engine to forego the attempted decoding of at least one other block in the same packet, and use the decoding iterations of the foregone attempted decoding to augment the budget of at least one block in at least one other packet.

12. A decoder arranged to decode a signal comprising a number of packets, wherein each packet contains at least one block of encoded data and the decoder comprises:

a decoding engine, including a processor, arranged to attempt to decode the packets by applying decoding iterations to the blocks, and a decoding manager arranged to detect when there are no fresh blocks of the signal on which the engine can attempt decoding and in response permit the engine to apply at least one further decoding iteration to a retry block, wherein a fresh block is a block on which the engine has not attempted decoding, and a retry block is a block that has not yet been successfully decoded within a packet on which decoding has already been attempted.

13. A decoder according to claim 12, wherein a fresh block is a block on which the engine has not attempted decoding and which the engine is not barred from decoding.

* * * * *